United States Patent
Chang et al.

(10) Patent No.: US 8,054,903 B2
(45) Date of Patent: Nov. 8, 2011

(54) DIGITAL BROADCASTING TRANSMISSION/RECEPTION DEVICES CAPABLE OF IMPROVING A RECEIVING PERFORMANCE AND SIGNAL PROCESSING METHOD THEREOF

(75) Inventors: Yong-deok Chang, Suwon-si (KR); Hae-joo Jeong, Seoul (KR); Eui-jung Park, Seoul (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 0 days.

(21) Appl. No.: 12/728,429

(22) Filed: Mar. 22, 2010

(65) Prior Publication Data

US 2010/0172447 A1 Jul. 8, 2010

Related U.S. Application Data

(63) Continuation of application No. 11/587,925, filed as application No. PCT/KR2005/001465 on May 19, 2005.

(30) Foreign Application Priority Data

| May 20, 2004 | (KR) | 2004-36002 |
| May 18, 2005 | (KR) | 2005-41532 |
| May 18, 2005 | (KR) | 2005-41541 |

(51) Int. Cl.
*H04L 5/12* (2006.01)
*H04L 23/02* (2006.01)
*H04K 1/10* (2006.01)
*H04L 27/28* (2006.01)

(52) U.S. Cl. .......... 375/265; 375/260; 375/261

(58) Field of Classification Search .......... 375/265
See application file for complete search history.

(56) References Cited

U.S. PATENT DOCUMENTS

| 6,608,870 | B1 * | 8/2003 | Fimoff ............. 375/270 |
| 6,717,961 | B1 | 4/2004 | Park |
| 6,765,931 | B1 | 7/2004 | Rabenko et al. |
| 6,912,209 | B1 | 6/2005 | Thi et al. |
| 6,985,492 | B1 | 1/2006 | Thi et al. |
| 7,023,868 | B2 | 4/2006 | Rabenko et al. |
| 7,209,455 | B2 | 4/2007 | Yee et al. |
| 2001/0033583 | A1 | 10/2001 | Rabenko et al. |
| 2002/0061012 | A1 | 5/2002 | Thi et al. |
| 2002/0114301 | A1 | 8/2002 | Yee et al. |
| 2002/0154248 | A1 | 10/2002 | Wittig et al. |
| 2002/0172277 | A1* | 11/2002 | Choi et al. ............. 375/240.01 |

(Continued)

FOREIGN PATENT DOCUMENTS

CN 1954607 4/2007

(Continued)

*Primary Examiner* — David C. Payne
*Assistant Examiner* — Erin File
(74) *Attorney, Agent, or Firm* — Stanzione & Kim, LLP

(57) ABSTRACT

Disclosed is a digital broadcasting transmission/reception system having an improved reception performance and a signal-processing method thereof. A digital broadcasting transmitter comprises a randomizer for inputting dual TS stream consists of robust and normal packets having stuff bytes inserted in predetermined positions and randomizing the dual TS stream; a stuff byte exchanger for replacing the stuff byte of a randomized data stream from the randomizer to a predetermined known data; and an encoder for encoding a data streams to which the known data is inserted. Accordingly, the present invention detects the known data from a signal received from a reception side and uses the detected known data for synchronization and equalization, so that the digital broadcasting reception performance can be improved at poor multipath channels.

17 Claims, 14 Drawing Sheets

U.S. PATENT DOCUMENTS

| | | |
|---|---|---|
| 2002/0186790 A1* | 12/2002 | Choi et al. .................... 375/321 |
| 2002/0191712 A1 | 12/2002 | Gaddam et al. |
| 2002/0194570 A1 | 12/2002 | Birru et al. |
| 2003/0099303 A1 | 5/2003 | Birru et al. |
| 2005/0031097 A1 | 2/2005 | Rabenko et al. |
| 2005/0058089 A1* | 3/2005 | Vijayan et al. ................ 370/312 |
| 2005/0190976 A1* | 9/2005 | Todoroki et al. ............. 382/236 |
| 2007/0165578 A1 | 7/2007 | Yee et al. |
| 2008/0266462 A1* | 10/2008 | Chang et al. .................. 348/723 |
| 2008/0288663 A1 | 11/2008 | Kovacevic et al. |
| 2009/0103664 A1* | 4/2009 | Jeong et al. ................... 375/341 |
| 2009/0103665 A1* | 4/2009 | Jeong et al. ................... 375/341 |

FOREIGN PATENT DOCUMENTS

WO    WO2004-062283    7/2004

* cited by examiner

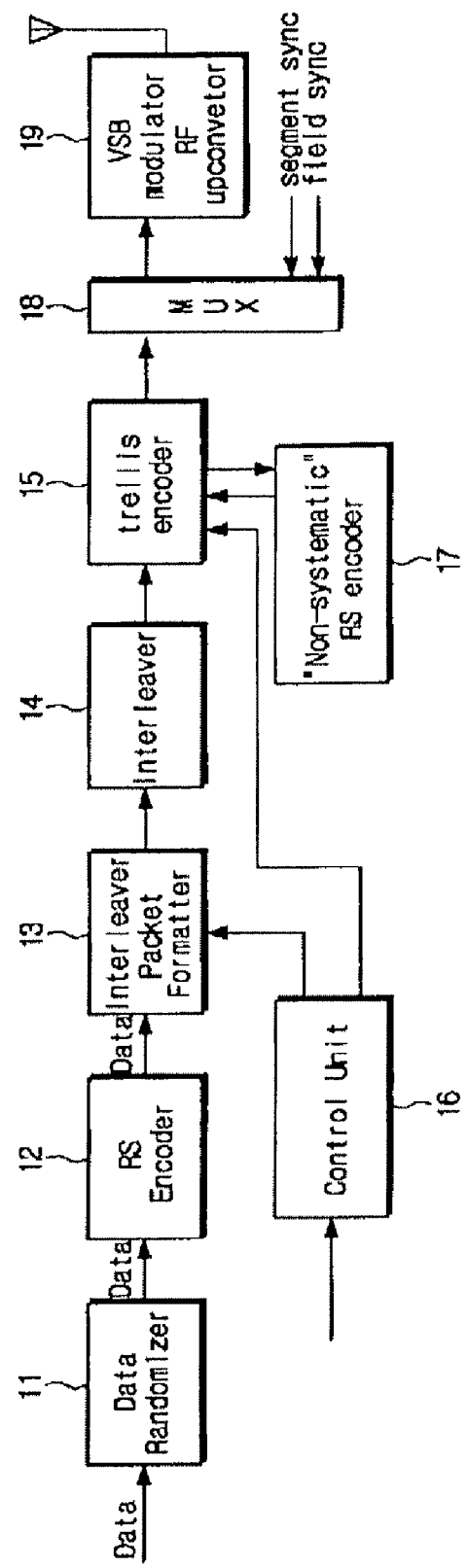
[Fig. 1]
(Related Art)

[Fig. 2]
(RELATED ART)
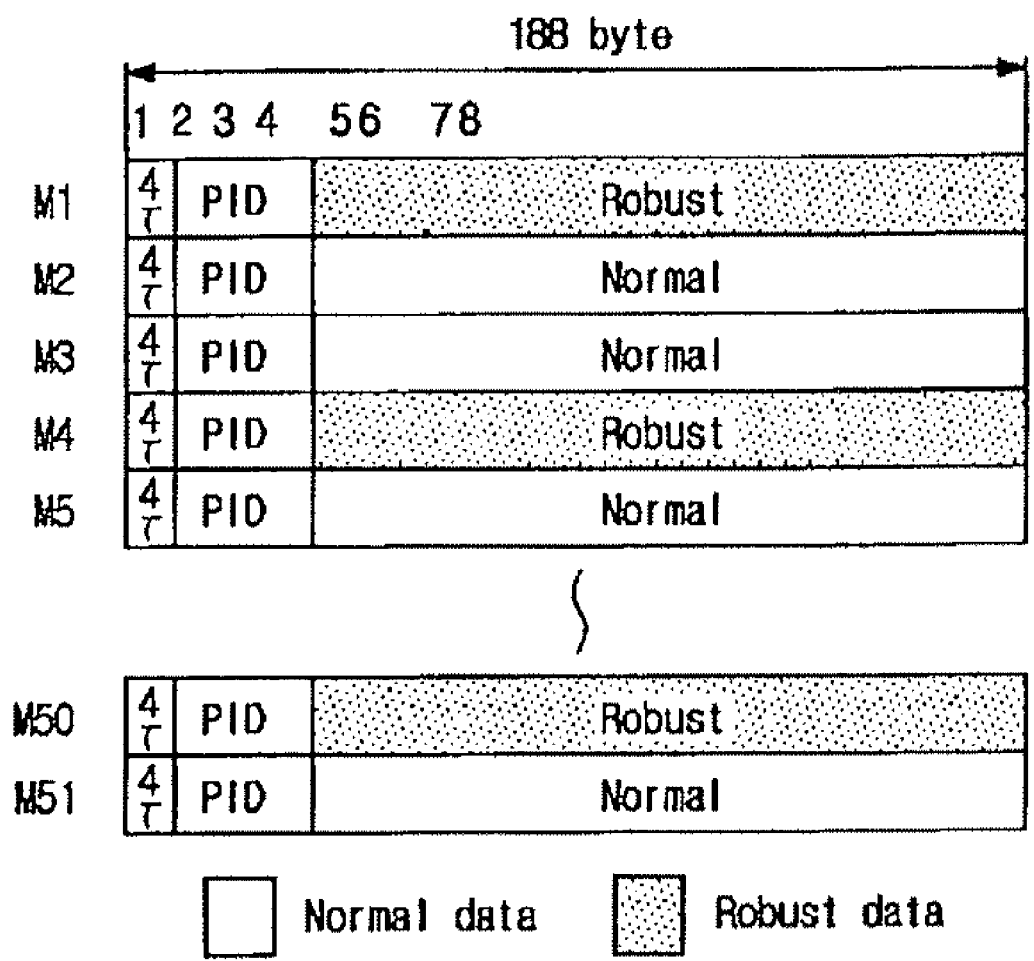

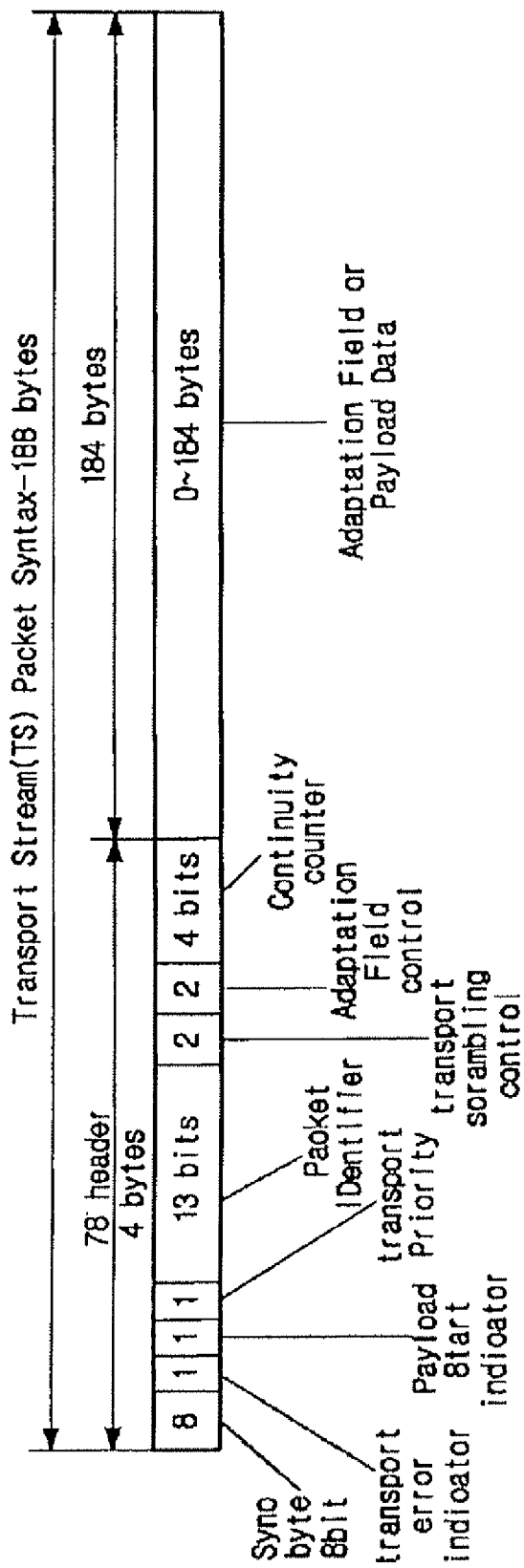

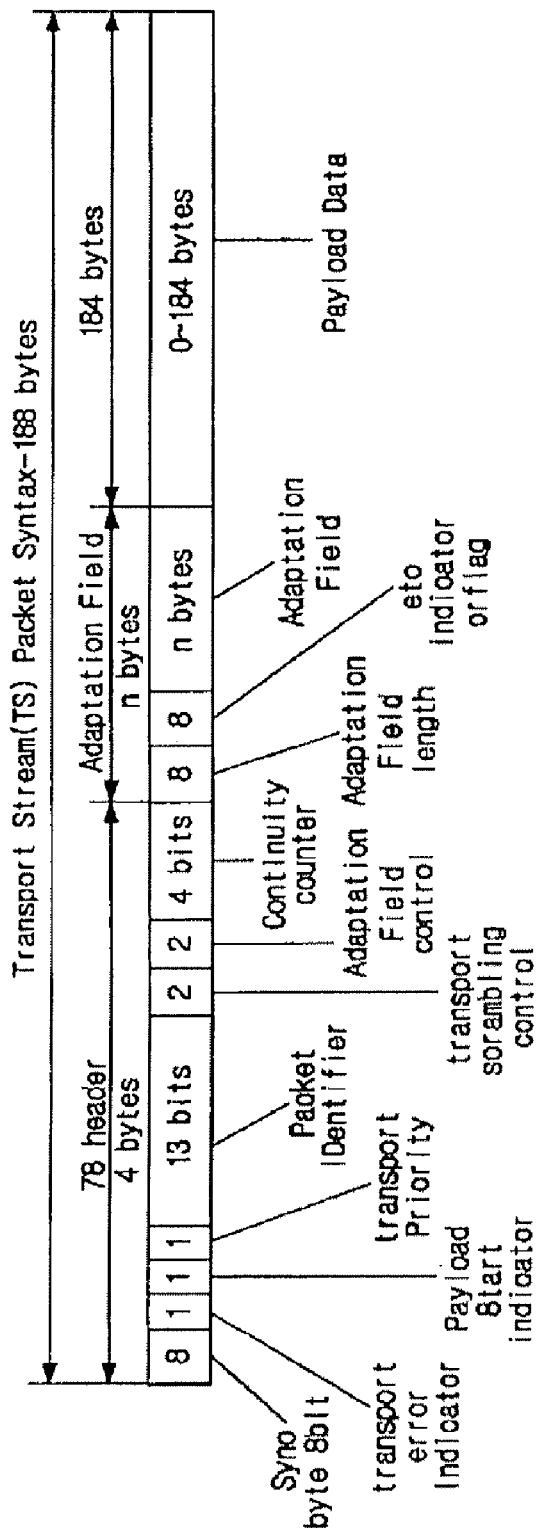
[Fig. 4]

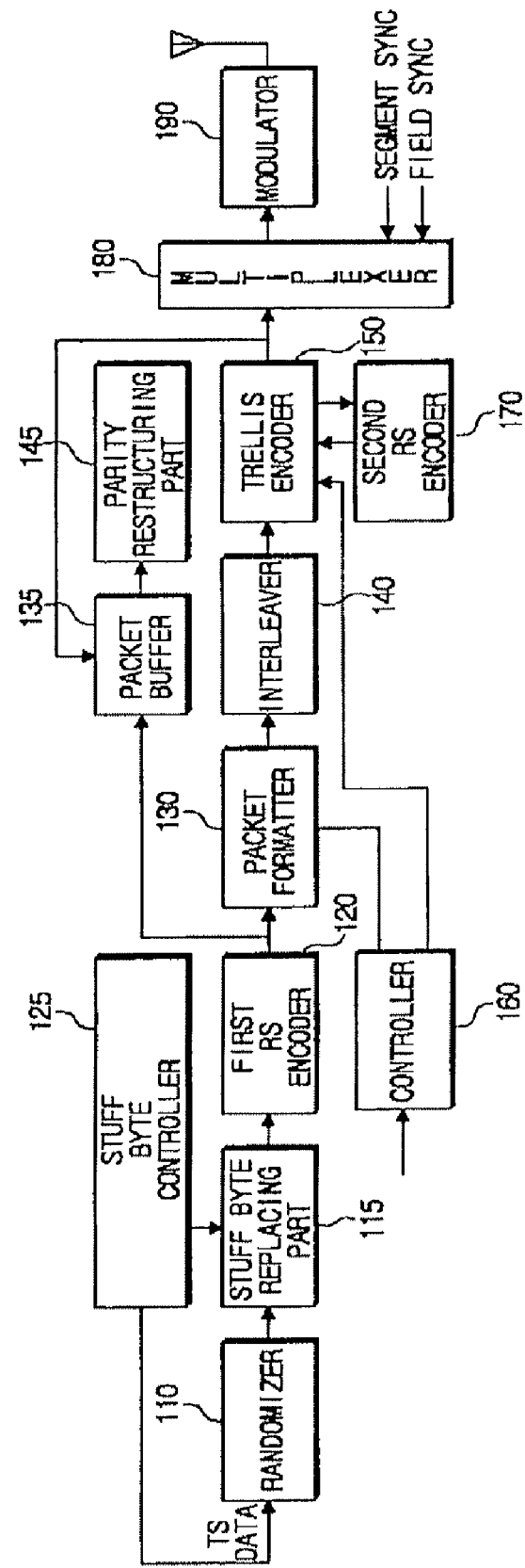
[Fig. 5]

[Fig. 6]
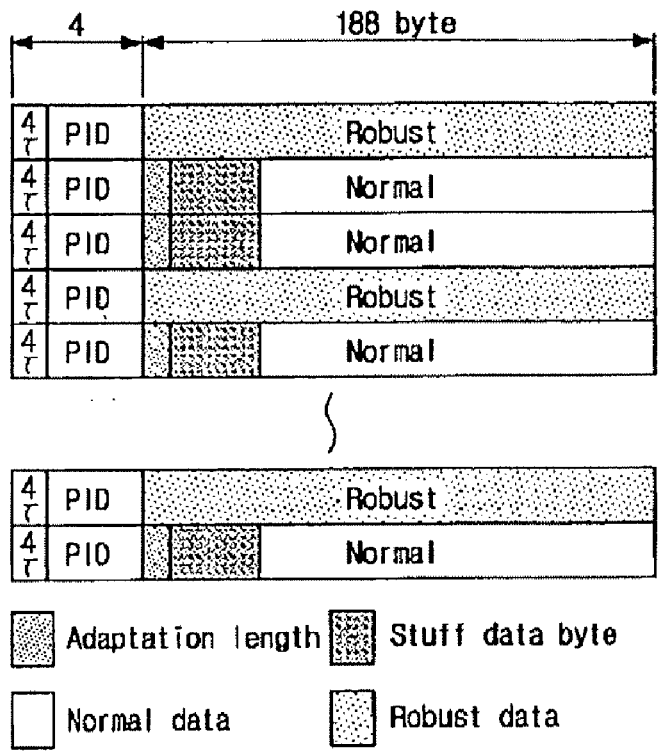
[Fig. 7]
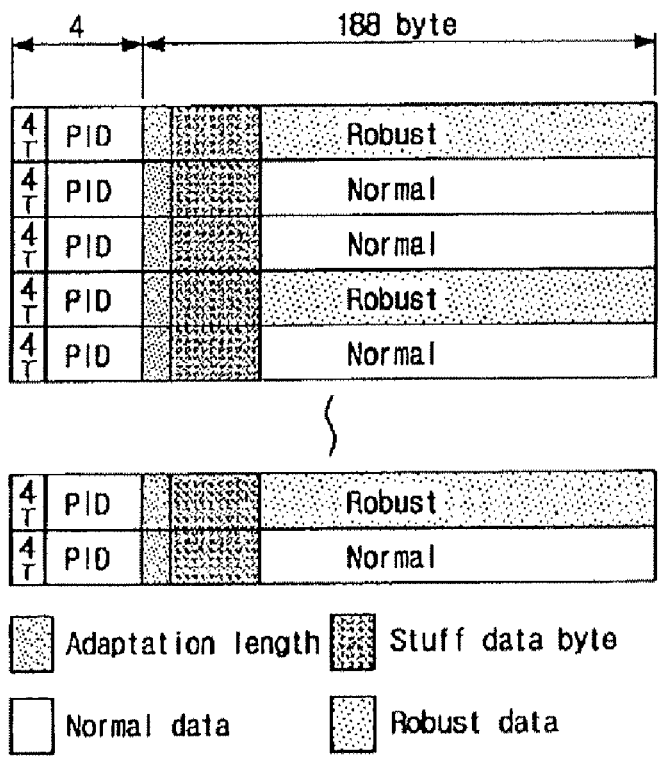

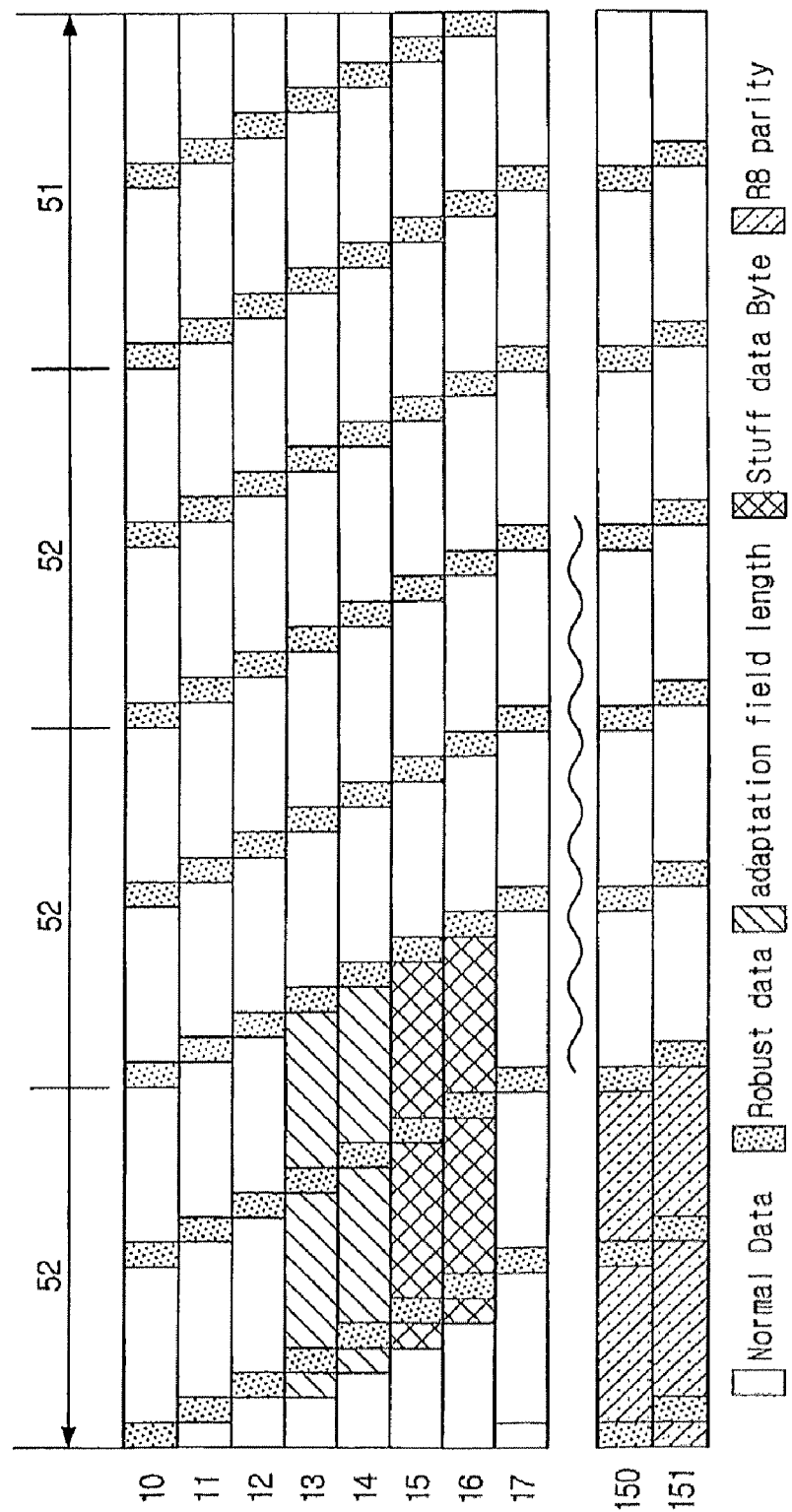
[Fig. 8]

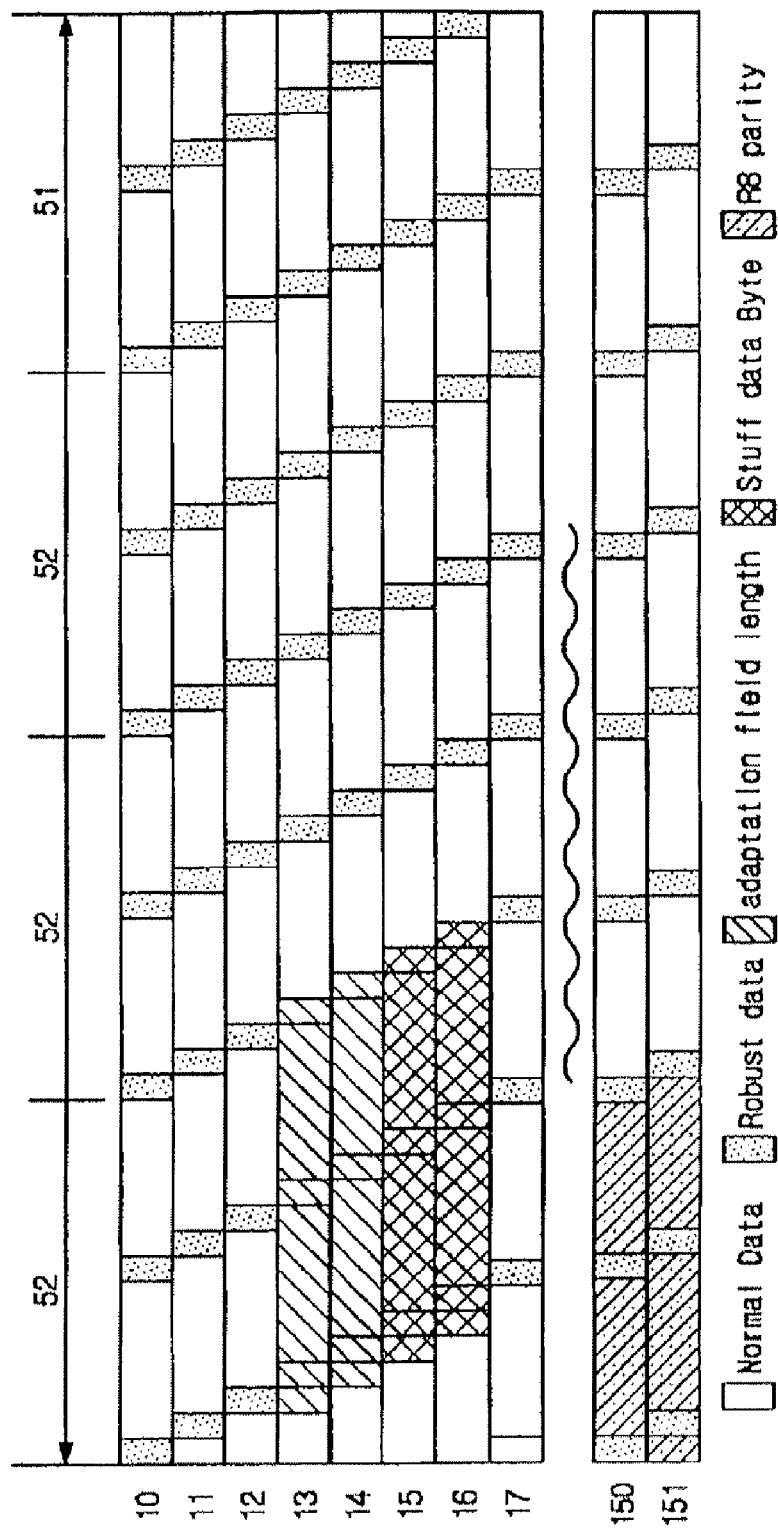
[Fig. 9]

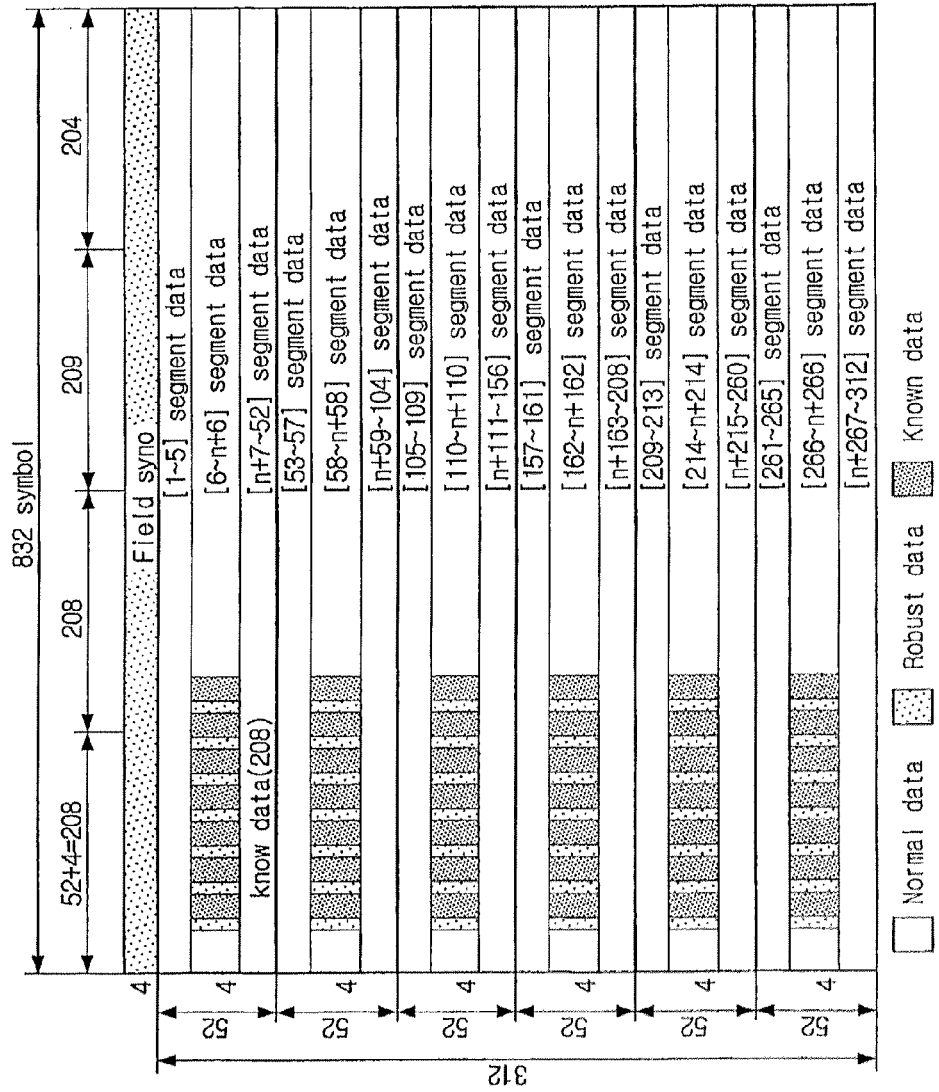
[Fig. 10]

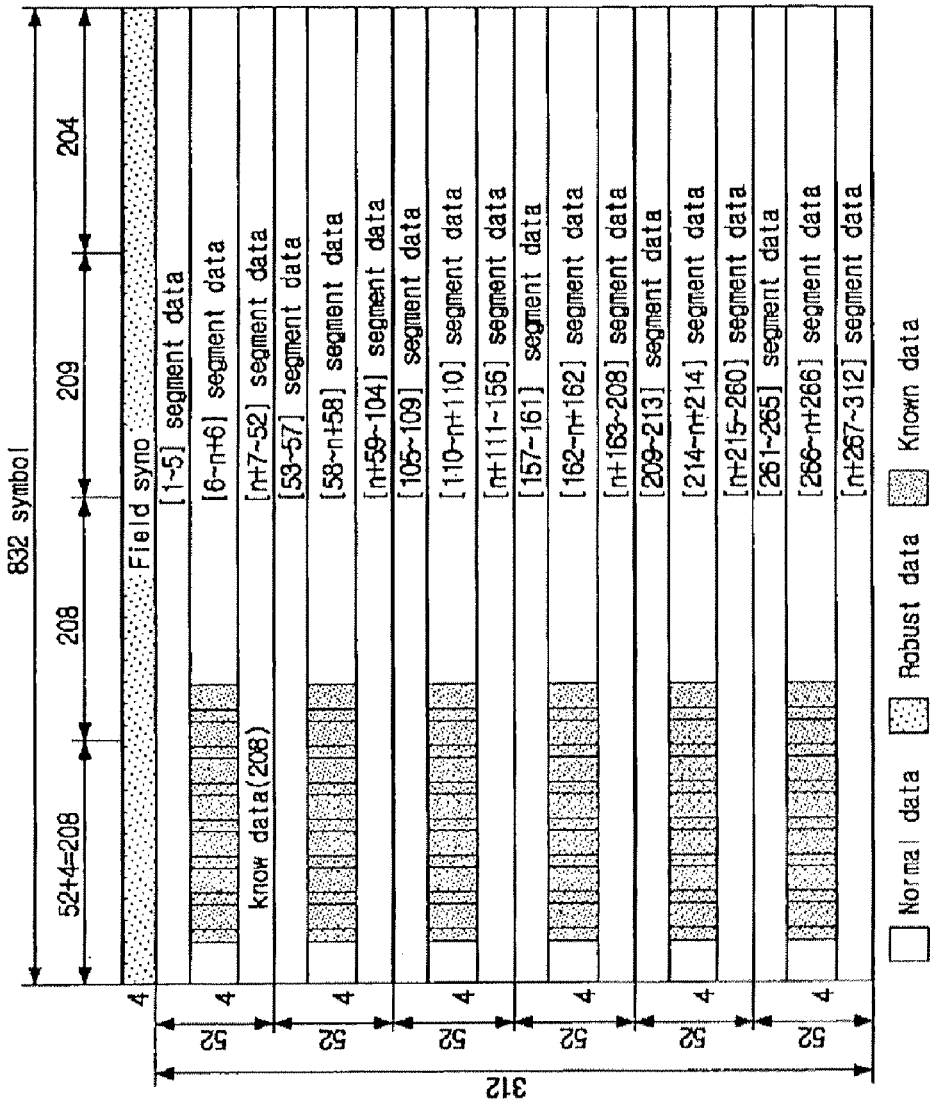
[Fig. 11]

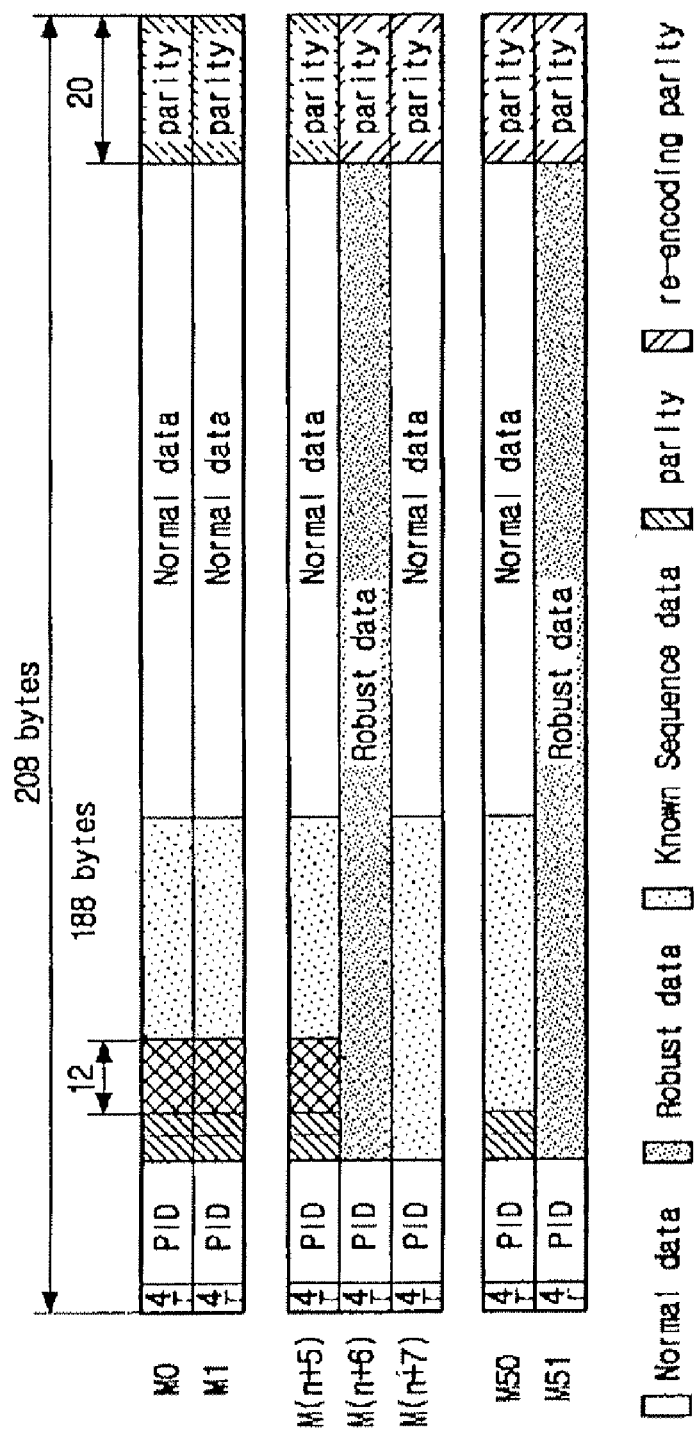
[Fig. 12]

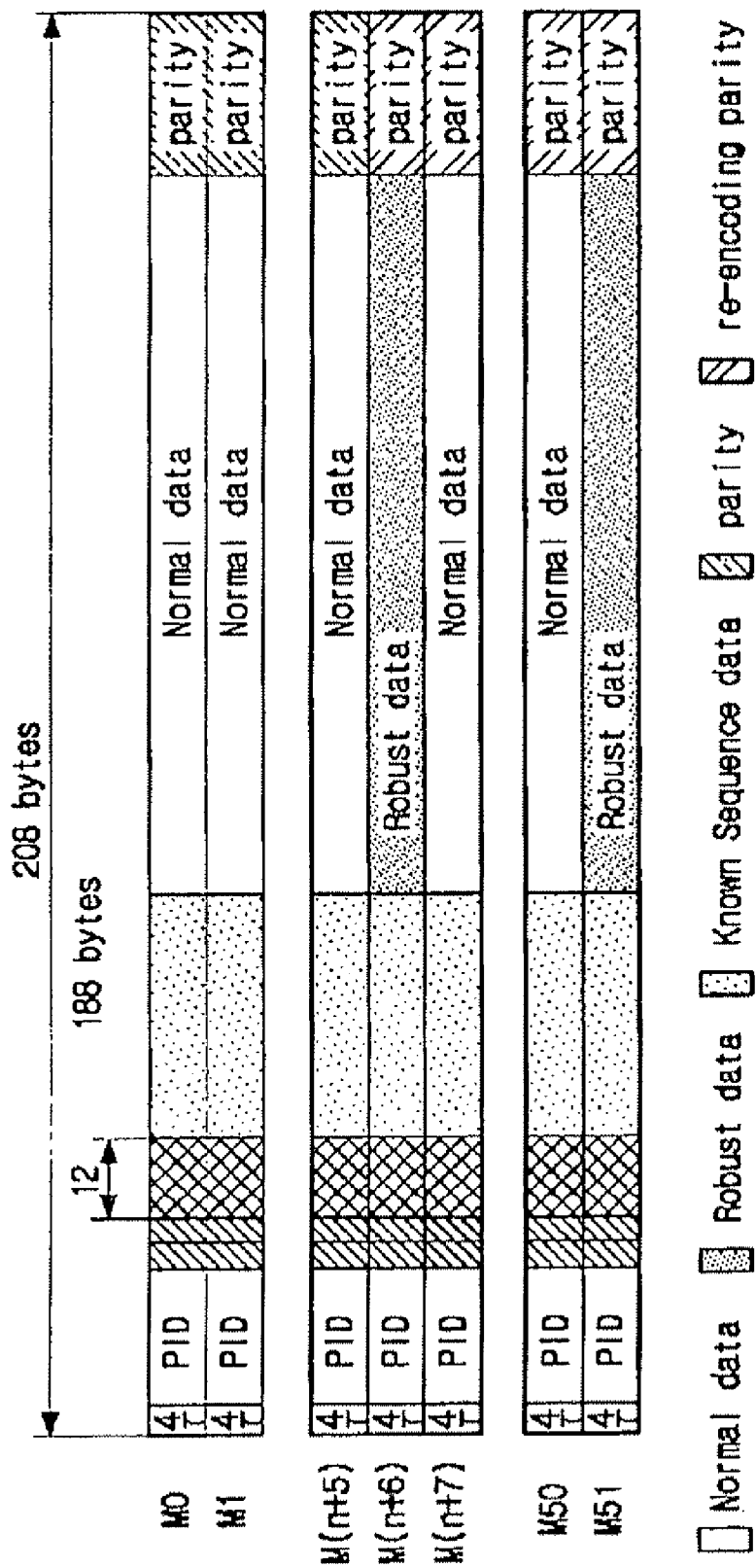
[Fig. 13]

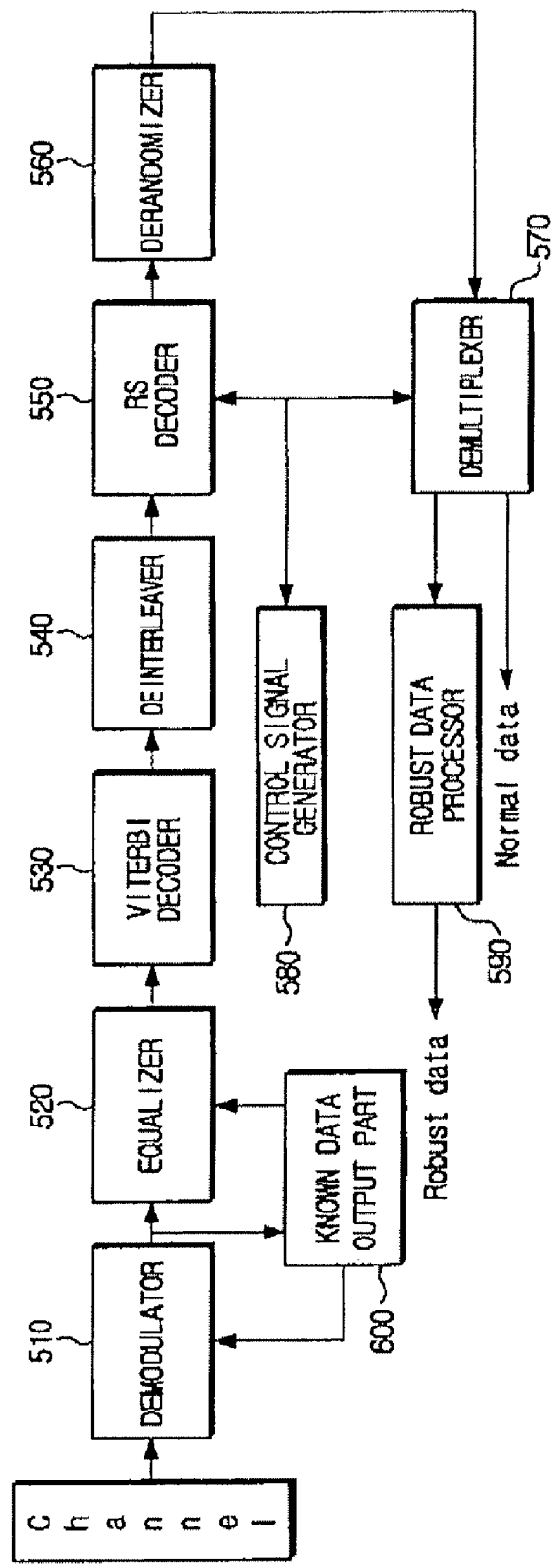
[Fig. 14]

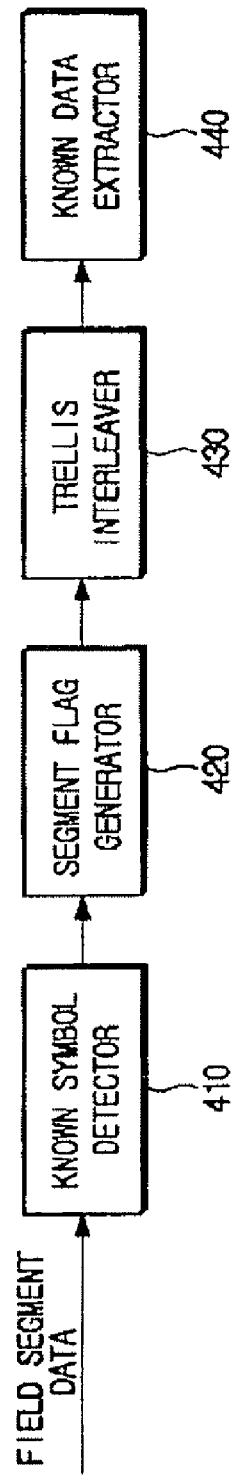
[Fig. 15]

DIGITAL BROADCASTING TRANSMISSION/RECEPTION DEVICES CAPABLE OF IMPROVING A RECEIVING PERFORMANCE AND SIGNAL PROCESSING METHOD THEREOF

CROSS-REFERENCE TO RELATED APPLICATIONS

This application is a Continuation of prior application Ser. No. 11/587,925, filed Oct. 26, 2006, in the U.S. Patent and Trademark Office, which claims priority from Korean Patent Application Nos. 2004-36002; 2005-41541 and 2005-41532, filed on May 20, 2004; May 18, 2005; and May 18, 2005, respectively, in the Korean Intellectual Property Office, and International application PCT/KR2005/001465, filed on May 19, 2005, the disclosures of which are incorporated herein in their entirety by reference.

BACKGROUND

1. Field of the Invention

The present invention relates to a digital broadcasting transmitter and receiver, and more specifically, to a digital broadcasting transmitter for replacing and transmitting stuff bytes inserted in data stream with predefined known data in a dual stream to enhance reception performance and a signal processing method thereof, and a corresponding digital broadcasting receiver and a signal processing method thereof.

2. Description of the Related Art

The Advanced Television Systems Committee Vestigial Sideband (ATSC VSB), U.S-oriented terrestrial waves digital broadcasting system, is a single carrier scheme and uses field synchronizing signal by 312 segment unit. Accordingly, reception performance is not good in poor channels, especially in a doppler fading channel.

FIG. 1 is a block diagram showing a conventional transmitter of the ATSC VSB. The digital broadcasting transmitter of FIG. 1, which is an Enhanced Vestigial Sideband (EVSB) system proposed by Philips, forms and transmits a dual stream by adding a robust data to a normal data of the existing ATSC VSB system.

As shown in FIG. 1, the digital broadcasting transmitter has a randomizer (11) for randomizing data, a first RS encoder (12) for performing RS encoding of the randomized data, a packet formatter (13) for interleaving the robust data of the encoded data, restructuring a packet at ½ rate, inserting a packet identifier (PID) and multiplexing the data with the normal data, an interleaver (14) for interleaving the data, a Trellis encoder (15) for performing enhanced coding and then the general ⅔ rate Trellis encoding of the robust data of the interleaved data, a controller (16) for outputting a signal to control the normal data and robust data, a second RS encoder (17) for performing RS re-encoding of the enhanced-coded robust data to be compatible with the existing receiver and replacing parity, a multiplexer (18) for inserting field sync and segment sync in the Trellis-coded data, and a modulator (19) for adding a pilot to the multiplexed signal and carrying out Vestigial Sideband (VSB) modulation and RF upconverting.

Referring to FIG. 1, the normal data and robust data are multiplexed (not shown) according to the dual stream scheme which transmits the normal data and robust data in one channel and the multiplexed data are input to the randomizer (11). The input data are randomized by the randomizer (11), input to the first RS encoder (12), RS encoded to correct channel-generated errors, and input to the packet formatter (13). Then the robust processing is performed such that the robust data of the encoded data are interleaved, restructured with packet at ½ rate and inserted with the PID. The data after the robust processing are then multiplexed with the normal data and output.

FIG. 2 shows a data format output from the packet formatter (13) of FIG. 1.

Referring to FIG. 2, the normal data and robust data are arranged at certain intervals so that the normal signal and robust signal after Trellis encoding are distributed at regular intervals.

The resultant output data are interleaved through the interleaver (14) which disperses the data, the robust data are enhanced-coded, and the data are Trellis-encoded through the Trellis encoder (15) which performs the general ⅔ rate Trellis encoding. The enhanced-coded robust data are RS re-encoded to be compatible with the existing receiver and the parity is sent to the Trellis encoder (15) through the second RS encoder (17) which replaces the parity. The signal passes through the multiplexer (18) which inserts the field sync and segment sync in the Trellis-encoded data, and is sent to the modulator (19) which adds pilot and performs VSB modulation and RF upconverting with respect to the signal, and then transmitted. Here, the normal data and robust data are controlled by the controller (16) which outputs a signal to control the normal data and robust data.

The U.S-oriented terrestrial waves digital television system of FIG. 1 is constructed to form a dual stream by adding the robust data in the normal data of the existing ATSC VSB system and transmit the dual stream, so that the existing normal data and the robust data are transmitted altogether.

However, the U.S-oriented terrestrial waves digital television system of FIG. 1 has a problem that in spite of transmitting the dual stream with the robust data added, poor transmission performance at multipath channels due to transmission of the existing normal stream is almost not improved. In other words, the improved normal stream rarely improves reception performance and the robust stream has no remarkable effect on reception performance in the multipath environment.

SUMMARY

An aspect of the present invention is to provide a digital broadcasting transmitter which replaces stuff bytes inserted in dual stream with known data and transmits the data to enhance transmission performance, and a signal processing method thereof, and a corresponding digital broadcasting receiver and a signal processing method thereof.

To achieve an aspect of the present invention, a digital broadcasting transmitter comprises a randomizer for receiving and randomizing a dual TS stream of a pre-determined format in which a robust data packet is inserted at certain intervals in a normal data packet, the normal data being inserted with stuff bytes at a certain location, a stuff byte replacing part for replacing the stuff bytes of the data output from the randomizer with a predetermined known data, a first RS encoder for performing RS encoding of the data output from the stuff byte replacing part, a packet formatter for interleaving the robust packet of the data output from the first RS encoder and restructuring the format, an interleaver for interleaving the data output from the packet formatter, a Trellis encoder for Trellis-encoding the data output from the interleaver, a second RS encoder for RS-encoding the robust packet of the Trellis-encoded data to alter parity and inputting it to the Trellis encoder, and a modulator for modulating the data output from the Trellis encoder and performing RF upconverting.

Preferably, the Trellis encoder has a memory for Trellis encoding, and initializes the memory of the data which is input from the location where the stuff bytes are inserted.

Preferably, the digital broadcasting transmitter further comprises a stuff byte controller for generating a control signal to indicate the location information of the stuff bytes and control the memory initialization of the Trellis encoder.

Further, the digital broadcasting transmitter further comprises a packet buffer for outputting and temporarily storing the data corresponding to the location of the stuff bytes of the data output from the first RS encoder.

More preferably, the packet buffer receives the data altered according to the memory initialization from the Trellis encoder and updates the temporarily stored data.

Further, the digital broadcasting transmitter further comprises a parity restructuring part for receiving the updated data from the packet buffer, performing RS encoding of the data to generate the altered parity, and outputting the altered parity to the Trellis encoder to replace the parity added by the first RS encoder.

More preferably, the stuff bytes are inserted in an adaptation field of the normal data packet.

Further, the information on the location and length of the inserted stuff bytes is inserted at a certain location of the normal data packet.

In addition, the known data may have a sequence with a predefined certain pattern.

Meanwhile, a method for signal processing for a digital broadcasting transmitter comprises a randomizing step of receiving and randomizing a dual TS stream of a certain format in which a robust data packet is inserted at certain intervals in a normal data packet, the normal data being inserted with stuff bytes at a certain location, a stuff byte replacing step of replacing the stuff bytes in the data output from the randomizing step with predetermined known data, a first RS encoding step of performing RS encoding of the data output from the stuff byte replacing step, a packet restructuring step of interleaving the robust packet in the data output in the first RS encoding step and restructuring the format, a interleaving step of interleaving the data output from the packet restructuring step, a Trellis encoding step of performing Trellis encoding of the interleaved data, a second RS encoding step of performing RS encoding of the robust packet of the Trellis encoded data to alter parity and inputting it to the Trellis encoding step and a modulating step of modulating the data output from the Trellis encoding step and RF upconverting.

Further, a digital broadcasting transmitter according to the present invention comprises a randomizer for randomizing a dual TS stream of a certain format having a normal data packet in which stuff bytes are inserted at a certain location, and a robust data packet, a stuff byte replacing part for replacing the stuff bytes of the data output from the randomizer with a predetermined known data, a first RS encoder for performing RS encoding of the data output from the stuff byte replacing part, an packet formatter for interleaving the robust packet of the data output from the first RS encoder and restructuring a format, an interleaver for interleaving the data output from the packet formatter, a Trellis encoder for performing Trellis encoding of the data output from the interleaver, a second RS encoder for performing RS encoding of the robust packet of the Trellis encoded data to alter parity and inputting the data to the Trellis encoder, and a modulator for modulating the data output from the Trellis encoder and performing RF upconverting.

In addition, a method for signal processing for a digital broadcasting transmitter comprises a randomizing step of randomizing a dual TS stream of a certain format having a normal data packet in which the stuff bytes are inserted at a certain location, and robust data packet, a stuff byte replacing step of replacing the stuff bytes of the data output from the randomizing step with a predetermined known data, a first RS encoding step of performing RS encoding of the data output from the stuff byte replacing step, a packet restructuring step of interleaving the robust packet of the data output from the first RS encoding step and restructuring the format, a interleaving step of interleaving the data output from the packet restructuring step, a Trellis encoding step of performing Trellis encoding of the interleaved data, a second RS encoding step of performing RS encoding of the robust packet of the Trellis encoded data to alter parity and inputting the data to the Trellis encoding step, and a modulating step of modulating the data output from the Trellis encoding step and RF upconverting.

A digital broadcasting receiver according to the present invention corresponding to the above digital broadcasting transmitter comprises a demodulator for receiving and demodulating an encoded signal from a digital broadcasting transmitter, the encoded signal being encoded by inserting a predetermined known data in a certain location of dual stream where stuff bytes are inserted, a known data output part for detecting the location of the known data from the demodulated signal and outputting the known data, an equalizer for equalizing the demodulated signal, a Viterbi decoder for error-correcting and decoding of the equalized signal using the detected known data, a deinterleaver for deinterleaving data output from the Viterbi decoder, and a derandomizer for derandomizing data output from the deinterleaver.

Preferably, the known data output part includes a known symbol detector for detecting information on the certain location of the received signal where the known data is inserted, a segment flag generator for generating data frame which includes one or more segments to indicate the certain location with a predetermined identification flag, a Trellis interleaver for encoding the data frame according to the encoding in the digital broadcasting transmitter, and a known data extractor for inserting and outputting the known data at the certain location of the interleaved data frame which is indicated by the identification flag.

More preferably, the known data output part outputs the detected known data to the demodulator, and the demodulator performs demodulation using the known data.

Meanwhile, a method for signal processing for a digital broadcasting receiver comprises a demodulating step of receiving and demodulating an encoded signal from a digital broadcasting transmitter, the encoded signal being encoded by inserting a pre-determined known data in a certain location of dual stream where stuff bytes are inserted, a known data outputting step of detecting the location of the known data from the demodulated signal and outputting the known data, a equalizing step of equalizing the demodulated signal, a decoding step of error-correcting and decoding of the equalized signal using the detected known data, a deinterleaving step of deinterleaving data output from the decoding step, and a derandomizing step of derandomizing data output from the deinterleaving step.

According to the present invention, a digital broadcasting transmitter inserts stuff bytes in a MPEG-2 TS packet, replaces the inserted stuff bytes with known data and transmits the data, and a digital broadcasting receiver detects and uses the known data. Accordingly, there are effects of compatibility with the existing digital broadcasting system, lower complexity of hardware, and enhanced digital broadcasting reception performance in poor multipath channels.

BRIEF DESCRIPTION OF THE DRAWINGS

FIG. 1 is a block diagram of a transmitter of a conventional U.S-oriented terrestrial waves digital broadcasting (ATSC VSB) system, FIG. 2 is a view showing a format of ATSC VSB data, FIG. 3 is a view showing a frame structure of a TS packet, FIG. 4 is a view showing a frame structure of a TS packet including stuff bytes according to the present invention, FIG. 5 is a block diagram of a digital broadcasting transmitter according to the present invention, FIG. 6 and FIG. 7 are views showing a format of data output from a randomizer of FIG. 5, FIG. 8 and FIG. 9 are views showing a format of data output from an interleaver of FIG. 5, FIG. 10 and FIG. 11 are views showing a format of data output from a Trellis encoder of FIG. 5, FIG. 12 and FIG. 13 are views showing a format of data with parity restructured according to Trellis encoder initialization of FIG. 5, FIG. 14 is a block diagram of a digital broadcasting transmitter according to the present invention, and FIG. 15 is a view provided to describe a known data output part of FIG. 10.

DETAILED DESCRIPTION OF THE EMBODIMENTS

Hereinafter, the present invention will be described in detail with reference to the accompanying drawings.

FIG. 5 is a block diagram of a digital broadcasting transmitter according to the present invention. The digital broadcasting transmitter of FIG. 5 is implemented using the EVSB system of FIG. 1 that Philips proposed. In detail, stuff bytes are added in a MPEG-2 packet of a normal stream or robust stream, and the added stuff bytes are replaced with known data in the digital broadcasting transmitter and are transmitted. Then, the known data are detected in a receiver and used to compensate distortion by a channel.

Referring to FIG. 5, the digital broadcasting transmitter has a randomizer (110) for randomizing the data when the normal data and robust data are multiplexed and input, a stuff byte replacing part (115) for replacing the stuff bytes of the normal stream or robust stream of the randomized data with a particular sequence, a first RS encoder (120) for performing Reed-Solomon encoding of the data output from the stuff byte replacing part (115) to correct errors by a channel, a packet formatter (130) for interleaving the robust data of the encoded data, restructuring the packet in ½ rate, inserting the PID and multiplexing with the normal data, an interleaver (140) for interleaving the data output from the packet formatter (130), a Trellis encoder (150) for initializing a memory value of stuff bytes of the data output from the interleaver (140), enhanced-coding the robust data and performing general ⅔ rate Trellis encoding, a controller (160) for outputting a signal to control the normal data and robust data, and a second RS encoder (170) for performing RS re-encoding of the enhanced-coded robust data to be compatible with the existing receiver and replacing parity.

In addition, the digital broadcasting transmitter has a stuff byte controller (125) for generating a signal to control a location of the stuff bytes, a packet buffer (135) for buffering the output of the first RS encoder (120) for the data initialization of the Trellis encoder (150), and receiving and updating the data altered according to the initialization of the Trellis encoder (150), a parity restructuring part (145) for performing RS encoding of the data altered according to the initialization to generate a parity and inputting the generated parity to the Trellis encoder (150) to replace the existing parity, a multiplexer (180) for inserting field sync and segment sync in the data which is Trellis encoded and mapped, and a modulator (190) for adding a pilot to the signal output from the multiplexer (180) and performing the VSB modulation and RF upconverting.

The normal data packets or robust data packets which are input to the randomizer (110) according to the present invention include the stuff bytes inserted therein. FIG. 3 is a view showing a frame structure of a TS stream packet. FIG. 4 is a view showing a frame structure of a MPEG-2 TS stream packet including adaptation field with stuff bytes according to the present invention. An MPEG-2 packet of 188 bytes consists of an information signal (MPEG-2 header) of 4 bytes including MPEG sync, adaptation field length information of 1 byte, other information of 1 byte, adaptation field data with stuff bytes of n bytes, and ES data of '188−(4+2+n)' bytes.

A TS stream packet frame of FIG. 3 consists of MPEG-2 header and adaptation field or ES data. The normal data packet or robust data packet according to the present invention, as shown in FIG. 4, has structure in which stuff bytes are inserted in the adaptation field so that all the TS stream includes the adaptation field. Such an MPEG-2 TS packet is input as the normal data or robust data of FIG. 5.

In FIG. 5, the robust data are processed in a robust data pre-processor (not shown) and are multiplexed with the normal data to be sent to the randomizer (110).

The randomizer (110) randomizes the data whose the normal data and robust data are multiplexed as described above.

The data randomized through the randomizer (110) are input to the stuff byte replacing part (115) and the stuff bytes of the normal data and robust data are replaced with a particular sequence generated by a particular sequence generator (not shown) and are output. The particular sequence is data having a predefined pattern that the transmitter and the receiver already know, and is hereinafter referred to as 'known data'.

When the stuff bytes are inserted in a normal data packet, FIG. 6 shows a format of data output from the randomizer (120) in which n stuff bytes inserted in the normal data packet are replaced with the particular sequence data, that is, with the known data. Referring to FIG. 6, normal data packets and robust data packets are arranged at certain intervals and known data are inserted instead of stuff bytes in the adaptation fields of the normal data packets.

FIG. 7 shows the data format when stuff bytes are inserted in a normal data packet and robust data packet respectively, and n stuff bytes inserted in the normal data packet and robust data packet among the data output from the randomizer (120) are replaced with the particular sequence data, that is, with the known data. Referring to FIG. 7, the normal data packet and robust data packet are arranged at certain intervals and known data are inserted instead of stuff bytes in the adaptation fields of the normal data packet and robust data packet.

In addition, as described above, the header of MPEG-2 packet data output from in the randomizer (120) includes the first byte of a sync and 3 bytes of the PID. The first 2 bytes of adaptation field of certain bytes include information on adaptation field length.

In other words, the first 2 bytes of the adaptation field have information on length of stuff bytes, that is, the known data inserted in the adaptation field. As the beginning location of the known data in a packet is fixed, the receiver can know the information on location and length, that is, quantity of the known data according to the information inserted in the first 2 bytes of the adaptation field.

The data output from the stuff byte replacing part (115) are outer-coded through the first RS encoder (120) to correct errors by a channel. The robust data of the outer coded data are interleaved by the packet formatter (130), the packet of the robust data is restructured at ½ rate and the PID is inserted. Then, the robust data are multiplexed with the normal data and the data are interleaved in the interleaver (140).

FIG. 8 shows a format of data after replacing the stuff bytes inserted in the normal data with the known data and interleaving by the interleaver (140). MPEG-2 packets of FIG. 6 are dispersed in 52 units by the interleaver (140) as shown in FIG. 8. Data of the same byte location in an MPEG-2 packet construct the same column after data interleaving, as shown in FIG. 8.

Furthermore, FIG. 9 shows a format of data after replacing stuff bytes inserted in the normal data and robust data with the known data and interleaving by the interleaver (140). MPEG-2 packets of FIG. 7 are dispersed in 52 units by the interleaver (140) as in FIG. 9. Data of the same byte location in an MPEG-2 packet construct the same column after data interleaving, as shown in FIG. 9.

Then, the robust data of the data output by the interleaver (140) are enhanced-coded and processed with the existing ⅔ rate Trellis encoding by the Trellis encoder (150).

FIG. 10 shows the output data formats after a data stream of FIG. 8 is Trellis-encoded by the Trellis encoder (150). One field includes six convolutional interleavers so that six sequences including stuff bytes are generated. In other words, if TS stream has 10 stuff bytes, known symbol sequences of '0*6=60' are generated in one field.

FIG. 11 shows the output data formats after a data stream of FIG. 9 is Trellis-encoded by the Trellis encoder (150).

Referring to FIG. 10 and FIG. 11, data of the same byte location in MPEG-2 packet are included in one data segment after Trellis encoding. Therefore, if stuff bytes are consecutively added in a certain location of MPEG-2 packet and randomized, and the stuff bytes are replaced with a particular sequence and Trellis encoded, the stuff bytes inserted in the same byte location form one data segment, which is a known signal. In result, the digital broadcasting receiver can detect and use the known data to improve reception performance.

In addition, the second RS encoder (170) carries out RS re-encoding of the enhanced-coded robust data to be compatible with the existing receiver and carries out non-systematic RS encoding to replace the parity.

The Trellis encoder (150) has its memory (now shown) for Trellis encoding. The Trellis encoder (150) performs initialization of the memory from the beginning location of the stuff bytes or known data.

Meanwhile, the packet buffer (135) receives and buffers the data corresponding to the location of memory initialization of the Trellis encoder (150) from the first RS encoder (120), and afterwards, receives the new data altered by the memory initialization of the Trellis encoder (150) and updates the previously buffered data, and inputs the updated data to the parity restructuring part (145). Accordingly, the parity restructuring part (145) performs RS encoding of the data altered by the memory initialization to generate the parity and the generated parity is input to the Trellis encoder (150) to replace the previous parity.

Furthermore, the controller (160) outputs a signal to control the normal data and robust data, and the stuff byte controller (125) generates a signal to control the location of stuff bytes.

The encoded data are mapped in an 8 level symbol and inserted with the field sync and segment sync to data formats as shown in FIG. 2 and FIG. 8. Then, DC offset is given and VSB modulation is performed to generate pilot by the modulator (190), and the data are converted into RF and transmitted.

Meanwhile, the stuff byte controller (125) detects the adaptation field length of FIG. 4, and generates and outputs a flag signal to indicate the location of the stuff bytes or known sequence data of FIG. 6 to FIG. 13, based on the detection.

The Trellis encoder (150) of FIG. 5 performs the 12 Trellis encoder initialization at the beginning location of the known data to initialize the value of a memory element of the encoder. The altered data by the initialization replaces the previous value stored in the packet buffer (135) and replaces the value of the previous parity location using the new parity generated by the parity restructuring part (145) according to the altered data.

FIG. 12 shows a data format after RS encoding and parity restructuring by the parity restructuring part (145) of FIG. 5 with respect to data with a format as shown in FIG. 10. Additionally, FIG. 13 shows a data format after RS encoding and parity restructuring by the parity restructuring part (145) of FIG. 5 with respect to data with a format as shown in FIG. 11.

Referring to FIG. 12 and FIG. 13, when the Trellis encoder (150) is initialized at the beginning location of the symbol sequence of the known data, the data value is altered by the initialization so that the output parity of the first RS encoder (120) is altered. Accordingly, the parity restructuring part (145) updates the previous parity with the altered parity to perform Trellis encoding so that there will be no problem when an RS decoder of a digital broadcasting receiver to be described later decodes the data.

In other words, memory initialization of the Trellis encoder (150) is performed in order for Trellis-encoded data to form a predefined particular sequence during symbol sequence section of the known data. Then, in order to alter parity corresponding to the altered data of the memory initialization location, RS encoding of the altered data is performed so that new parity is generated and the altered parity replaces the previous parity. FIG. 12 shows a process to replace a corresponding parity according to the altered data value by the memory initialization.

FIG. 14 is a block diagram of a digital broadcasting receiver corresponding to the digital broadcasting transmitter of FIG. 5 according to the present invention. If the received signal includes the normal data, robust data and stuff bytes, the digital broadcasting receiver has elements to decode them.

The digital broadcasting receiver of FIG. 14 includes a demodulator (310) for lowering an RF signal to baseband and demodulating it, an equalizer (320) for deleting inter-symbol interference, a Viterbi decoder (330) for correcting errors in the equalized signals and performing decoding, a deinterleaver (340), a packet formatter (350) for demultiplexing the output of the deinterleaver (340) and performing packet reformatting and deinterleaving of the robust data, a control signal generator (360) for generating a control signal to control a dual stream, an RS decoder (370) for RS correction and decoding of the data output from the packet formatter (350), a derandomizer (380) and a known data output part (400) for generating location of stuff bytes and processing known data.

The demodulator (310) converts the RF signal received via channel into a baseband signal through tuner/IF (not shown), detects and demodulates sync of the converted baseband signal. The equalizer (320) compensates multipath channel distortion of the demodulated signal.

Meanwhile, the known data output part (400) detects information on stuff byte quantity inserted in the reserved part of field sync data segment section to acquire location information on known symbol, and outputs the known data from the acquired location information.

FIG. 15 shows the known data output part (400) for detecting the known data of the digital broadcasting receiver.

The known data output part (400) includes a known symbol detector (410), a segment flag generator (420), a Trellis interleaver (430), and a known data extractor (440).

If the information on the quantity (the number) of stuff bytes is inserted in the reserved part of field sync data segment section, the known symbol detector (410) of the known data output part (400) in the digital broadcasting receiver detects the information on quantity of the known data. Based on the detected information, the segment flag generator (420) and the Trellis interleaver (430) acquire information on the location of the known symbol. From the acquired location information, the known data extractor (440) outputs the known data for use in improving reception performance of the digital broadcasting receiver is improved. As the location of stuff bytes is fixed all the time, if quantity of stuff bytes can be detected, the segment flag generator (420) and the Trellis interleaver (430) can be implemented using a counter and a control logic.

That is, the known symbol detector (410) extracts information on the known data location from control information bit including information on adaptation field length of the demodulated data header. The information on the known data location includes the information on known data length. As the known data location is preset, the location and number of the known symbols according to encoding of known data can be acquired by knowing the length.

According to the location and number of the known symbols, the segment flag generator (420) marks with a predetermined flag of length corresponding to the number of symbols at the corresponding location and generates at least one segment and a MPEG-2 transmission frame including the segment.

The Trellis interleaver (430) encodes the transmission frame generated in the segment flag generator (420) according to the interleaving in the digital broadcasting transmitter.

The known data extractor (440) inserts the predefined known data at the location of the known symbol which is identified by the flag of the transmission frames which are encoded and output from the Trellis interleaver (430), and outputs the known data-inserted data.

Meanwhile, the signal equalized by the equalizer (320) is error-corrected through the Viterbi decoder (330) and decoded into symbol data. The decoded data rearranges the data dispersed by the interleaver (140) of the transmitter of FIG. 5 through the deinterleaver (340). The deinterleaved data are de-multiplexed by the packet formatter (350) to be divided into the normal data and robust data. The robust data go through packet reformatting and deinterleaving and are input to the RS decoder (370) with the normal data, and error-corrected. The control signal generator (360) generates a control signal to process the normal data and robust data. The data output from the RS decoder (370) are derandomized through the derandomizer (380).

As described above, stuff bytes are generated and inserted in MPEG-2 TS packet, and the inserted stuff bytes are replaced with known data and transmitted from the digital broadcasting transmitter. Then the digital broadcasting receiver detects and uses the known data. Accordingly, reception performance of the digital broadcasting receiver, such as sync acquisition and equalizing performance, can be improved.

Furthermore, the stuff bytes are inserted in the existing transmission frame structure and only a reserved part is altered so that there are advantages that compatibility with the existing system is provided and additional hardware is easily implemented.

According to the present invention, stuff bytes are inserted in normal data or robust data of the MPEG-2 packet in the digital broadcasting transmitter, and the inserted stuff bytes are replaced with known data and transmitted, so that the digital broadcasting receiver detects and uses the known data. In result, implementation of hardware is not complicated and digital broadcasting reception performance at poor multipath channels can be improved.

What is claimed is:

1. A digital broadcasting receiver, comprising:
  a demodulator for receiving and demodulating an encoded signal from a digital broadcasting transmitter, the encoded signal being encoded by inserting a pre-determined known data in a certain location of dual stream;
  an equalizer for equalizing the demodulated signal;
  a known data output part for detecting the location of the known data from the demodulated signal and outputting the known data to the equalizer;
  a decoder for error-correcting and decoding of the equalized signal using the detected known data;
  a deinterleaver for deinterleaving data output from the decoder; and
  a derandomizer for derandomizing data output from the deinterleaver,
  wherein an additional data stream included in the encoded signal is a stream which is first Reed-Solomon (RS) encoded, first interleaved, packet-formatted, second RS encoded, second interleaved, trellis encoded and third RS encoded by the digital broadcasting transmitter.

2. The digital broadcasting receiver as claimed in claim 1, wherein the known data output part includes:
  a known symbol detector for detecting information on the certain location of the received signal where the known data is inserted;
  a segment flag generator for generating data frame which includes one or more segments to indicate the certain location with a predetermined identification flag;
  a Trellis interleaver for encoding the data frame according to the encoding in the digital broadcasting transmitter; and
  a known data extractor for inserting and outputting the known data at the certain location of the interleaved data frame which is indicated by the identification flag.

3. The digital broadcasting receiver as claimed in claim 1, wherein the known data output part outputs the detected known data to the demodulator, and the demodulator performs demodulation using the known data.

4. A method for signal processing for a digital broadcasting receiver, comprising:
  a demodulating step of receiving and demodulating an encoded signal from a digital broadcasting transmitter, the encoded signal being encoded by inserting a predetermined known data in a certain location of dual stream;
  an equalizing step of equalizing the demodulated signal using an equalizer; a known data outputting step of detecting the location of the known data from the demodulated signal and outputting the known data to the equalizer;
  a decoding step of error-correcting and decoding of the equalized signal using the detected known data;
  a deinterleaving step of deinterleaving data output from the decoding step; and a derandomizing step of derandomizing data output from the deinterleaving step, wherein an additional data stream included in the encoded signal is a stream which is first Reed-Solomon (RS) encoded, first interleaved, packet-formatted, second RS encoded, second interleaved, trellis encoded and third RS encoded by the digital broadcasting transmitter.

5. The method as claimed in claim 4, wherein the known data outputting step includes:
    detecting information on the certain location of the received signal where the known data is inserted;
    generating data frame which includes one or more segments to indicate the certain location with a predetermined identification flag;
    encoding the data frame according to the encoding in the digital broadcasting transmitter; and
    inserting and outputting the known data at the certain location of the interleaved data frame which is indicated by the identification flag.

6. The method as claimed in claim 4, wherein the known data outputting step outputs the detected known data to the demodulator, and the demodulator performs demodulation using the known data.

7. A digital broadcasting receiver comprising:
    a demodulator to convert an RF signal into a baseband signal and to detect and demodulate sync of the converted baseband signal;
    an equalizer to compensate multipath channel distortion of the demodulated signal;
    a known data detector to detect known data from a data stream of the demodulated signal comprising the known data and an additional data stream, extract the known data and output the known data to the equalizer; and
    a processor for processing the data stream using the detected known data,
    wherein the data stream is received from a digital broadcasting transmitter which comprises a trellis encoder for performing trellis encoding using internal memories and resetting the internal memories at a predetermined time in response to a control signal to control the memory reset, and
    wherein the additional data stream is processed by the digital broadcasting transmitter to be robust against errors,
    wherein the additional data stream is a stream which is first Reed-Solomon (RS) encoded, first interleaved, packet-formatted, second RS encoded, second interleaved, trellis encoded and third RS encoded by the digital broadcasting transmitter.

8. The digital broadcasting receiver as claimed in claim 7, wherein the known data is inserted in a predetermined position of the data stream by the digital broadcasting transmitter in response to a control signal to control insertion of the known data.

9. The digital broadcasting receiver as claimed in claim 7, wherein the data stream is processed by a Reed-Solomon (RS) encoder of the digital broadcasting transmitter compensating RS parities according to the memory reset.

10. The digital broadcasting receiver as claimed in claim 7, wherein the additional data stream is processed to be robust against errors, and is then multiplexed in the data stream by the digital broadcasting transmitter.

11. The digital broadcasting receiver as claimed in claim 10, wherein the processor comprises:
    a demodulator for demodulating the data stream;
    an equalizer for equalizing the data stream;
    a demultiplexer for demultiplexing the data stream into normal data and the additional data stream; and
    a robust data processor for decoding the demultiplexed additional data stream,
    wherein at least one of the demodulator and equalizer performs at least one of the demodulating and equalizing operations using the known data.

12. The digital broadcasting receiver as claimed in claim 11, wherein the processor further comprises:
    a control signal generator for controlling the demultiplexer to process the normal data and additional data stream in the data stream.

13. A method by which a digital broadcasting receiver processes streams, the method comprising:
    converting an RF signal into a baseband signal and demodulating sync of the converted baseband signal;
    detecting known data from a data stream of the demodulated signal comprising the known data and an additional data stream, extracting the known data and outputting the known data to an equalizer; and
    processing the data stream using the detected known data,
    wherein the data stream is received from a digital broadcasting transmitter which comprises a trellis encoder for performing trellis encoding using internal memories and resetting the internal memories at a predetermined time in response to a control signal to control the memory reset, and
    wherein the additional data stream is processed by the digital broadcasting transmitter to be robust against errors,
    wherein the additional data stream is a stream which is first Reed-Solomon (RS) encoded, first interleaved, packet-formatted, second RS encoded, second interleaved, trellis encoded and third RS encoded by the digital broadcasting transmitter.

14. The method as claimed in claim 13, wherein the known data is inserted in a predetermined position of the data stream by the digital broadcasting transmitter in response to a control signal to control insertion of the known data.

15. The method as claimed in claim 13, wherein the data stream is processed by a Reed-Solomon (RS) encoder of the digital broadcasting transmitter compensating RS parities according to the memory reset.

16. The method as claimed in claim 13, wherein the additional data stream is processed to be robust against errors, and is then multiplexed in the data stream by the digital broadcasting transmitter.

17. The method as claimed in claim 16, wherein the processing operation comprises:
    demodulating the data stream;
    equalizing the data stream;
    demultiplexing the data stream into normal data and the additional data stream; and
    robust-data-processing for decoding the demultiplexed additional data stream,
    wherein at least one of the demodulating and equalizing operations is performed using the known data.

* * * * *